United States Patent
Yuan

(10) Patent No.: US 6,756,613 B2
(45) Date of Patent: Jun. 29, 2004

(54) SHALLOW-MESA STRUCTURE FOR PLANAR PIN AND APD PHOTODIODES

(75) Inventor: Ping Yuan, Piscataway, NJ (US)

(73) Assignee: Multiplex, Inc., South Plainfied, NJ (US)

( * ) Notice: Subject to any disclaimer, the term of this patent is extended or adjusted under 35 U.S.C. 154(b) by 22 days.

(21) Appl. No.: 10/002,909

(22) Filed: Nov. 2, 2001

(65) Prior Publication Data

US 2002/0084468 A1 Jul. 4, 2002

Related U.S. Application Data

(60) Provisional application No. 60/245,902, filed on Nov. 3, 2000.

(51) Int. Cl.$^7$ ...................... H01L 31/072; H01L 31/109
(52) U.S. Cl. ...................... 257/186; 257/184; 257/188; 257/199; 257/79; 257/458
(58) Field of Search ................. 257/184, 186, 257/188, 198, 199, 458, 436, 432, 79, 99, 103, 459, 452, 180, 438, 466, 605, 81, 94, 97, 680, 21, 85, 431; 438/39, 41, 48, 65, 22

(56) References Cited

U.S. PATENT DOCUMENTS

| | | | |
|---|---|---|---|
| 4,544,938 A | * | 10/1985 | Scholl |
| 5,610,416 A | * | 3/1997 | Su et al. |
| 6,452,221 B1 | * | 9/2002 | Lai et al. ................. 257/192 |

OTHER PUBLICATIONS

Campbell et al. "Multiplication Noise of Wide–Bandwidth InP/InGaAsP/InGaAs Avalanche Photodiodes." *J. Lightwave Technol.*, vol. 7, No. 3, pp. 473–477, 1989.

Campbell et al. "High–Speed InP/InGaAsP/InGaAs Avalanche Photodiodes Grown by Chemical Beam Epitaxy," *IEEE J. Quantum Electron.*, vol. 24, No. 3, pp. 496–500, 1988.

Watanabe et al. "High–Speed and Low–Dark–Current Flip–Chip InAlAs/InAlGaAs Quaternary Well Superlattice APD's with 120 GHz Gain–Bandwidth Product," *IEEE Photon. Tech. Lett.*, vol. 5, No. 6, pp. 675–677, 1993.

Forrest. "Performance of $In_xGa_{1-x}As_yP_{1-y}$, Photodiodes with Dark Current Limited by Diffusion, Generation Recombination, and Tunneling" *IEEE J. Quantum Electron.*, vol. QE–17, No. 2, Feb. 1981.

Tarof et al. "Planar InP/InGaAs Avalanche Photodetectors with Partial Charge Sheet in Device Periphery," *Appl. Phys. Lett.*, vol. 57, No. 7, pp. 670–672, 1990.

Ekholm et al. "High Bandwidth Planar InP/InGaAs Avalanche Photodiodes," *IEEE Trans. On Electron Dev.*, vol. 35, No. 12, pp. 2434, 1988.

Bowers et al. "Chapter 17: High–Speed Photodetectors," *Handbook of Optics*, vol. 1, McGraw–Hill, New York, 1995.

* cited by examiner

*Primary Examiner*—Long Pham
*Assistant Examiner*—DiLinh Nguyen
(74) *Attorney, Agent, or Firm*—Testa, Hurwitz & Thibeault, LLP

(57) ABSTRACT

In one aspect the invention relates to a high bandwidth shallow mesa semiconductor photodiode responsive to incident electromagnetic radiation. The photodiode includes an absorption narrow bandgap layer, a wide bandgap layer disposed substantially adjacent to the absorption layer, a first doped layer having a first conductivity type disposed substantially adjacent to the wide bandgap layer, and a passivation region disposed substantially adjacent to the wide bandgap layer and the first doped layer.

6 Claims, 5 Drawing Sheets

//\# SHALLOW-MESA STRUCTURE FOR PLANAR PIN AND APD PHOTODIODES

CROSS-REFERENCE TO RELATED APPLICATION

This application claims priority to U.S. Provisional Patent Application Serial No. 60/245,902, filed on Nov. 3, 2000.

FIELD OF THE INVENTION

This invention relates generally to semiconductor devices, and more specifically to the structure of PIN photodiodes and APDs.

BACKGROUND OF THE INVENTION

For high-bit-rate, long-haul fiber-optic communications p-doped/intrinsic/n-doped (PIN) photodiodes and avalanche photodiodes (APDs) are frequently used as photodetectors due to their high sensitivity and bandwidth. Planar and mesa structures are two commonly used configurations for PIN Photodiodes and APDs. Mesa structure PIN photodiodes and APDs are sometimes grown by molecular beam epitaxy (MBE) or metalorganic chemical vapor deposition (MOCVD). These fabrication techniques allow the thickness of the layers and the wafer to be accurately controlled.

Referring to FIG. 1, a mesa structure PIN 2 known in the prior art is shown. The structure includes a top metal contact 8, two bottoms metal contacts 12, a p-doped Indium Gallium Arsenide (InGaAs) ohmic contact layer 64 lattice matched to Indium Phosphide (InP), a p-doped InP layer 68, an intrinsic narrow bandgap InGaAs absorption layer 76 lattice matched to InP, a n-doped InP layer 80, and passivation regions 32.

In fabrication after the layers 80, 76, 68, 64 are sequentially deposited, the mesa structure 84 is formed by chemical etching through the p-doped layers 64, 68 and the intrinsic absorption layer 76. Next, the exposed sidewalls of the p-doped layers 64, 68 and the intrinsic absorption layer 76 that define the mesa structure 84 are passivated with dielectric materials, such as $SiO_2$ or $SiN_x$. As part of this process, defects are inevitably introduced into the p-doped layers 64, 68 and the intrinsic absorption layer 76. The intrinsic InGaAs absorption layer 76 has a low bandgap and the mesa etching introduced defects create extra intraband energy levels. These in turn lead to a high dark current. The dark current in InGaAs PIN photodiodes and APDs fabricated according to the above method is one factor in the generally low reliability of these devices. The low reliability of these devices includes low sensitivity and high noise. These disadvantages significantly restrict the use of InGaAs PIN photodiodes and APDs in optical communications systems.

Referring to FIG. 2, a planar structure PIN photodiode 4 known in the prior art is shown. The structure 4 includes a top metal contact 8, two bottom metal contacts 12, an intrinsic InGaAs layer 16, an intrinsic InP layer 20, an intrinsic absorption InGaAs layer 76, a n-doped InP layer 28, passivation regions 32, a p-doped InGaAs diffusion region 36, and a p-doped InP diffusion region 40.

During fabrication of the planar structure PIN photodiode 4, the n-doped InP layer 28, the intrinsic InGaAs layer 76, the intrinsic layer InP 20, and the intrinsic InGaAs layer 16 are sequentially deposited. The p-doped regions 36 and 40 are then formed by diffusing, for example, Zinc (Zn) or Cadmium into the top central region of the device 4. After the diffusion step, the top metal contact 8 and the passivation regions 32 are added.

Although avoiding the introduction of defects into the intrinsic InGaAs layer 76 during passivation, planar structure PIN photodiodes 4 have disadvantages in device performance and design flexibility. The introduction of the p-dopant by diffusion is not a precise process, and, therefore, the thickness of the p-doped regions 36 and 40 cannot be accurately controlled. In some instances the p-dopant diffuses into the intrinsic InGaAs layer 76. In other instances the p-dopant does not diffuse completely through the intrinsic InP layer 20, or even through the intrinsic InGaAs layer 76. Another disadvantage of planar structure PIN photodiodes 4 is their higher parasitic capacitance. The parasitic capacitance exists between the conductive substrate and device pad. Mesa structure devices can avoid this problem, however, by employing a semi-insulating substrate.

An additional disadvantage of planar structure PIN photodiodes 4 is that their fabrication process is complex. In particular, the diffusion process requires that the surface of the layer to be doped be carefully prepared. A further disadvantage of planar structure PIN photodiodes 4 is the control of hazardous materials as part of the dopant diffusion. For example, in Zn diffusion, As, P, $Zn_3P_2$, and $Zn_3AS_2$, are heated to approximately 550 C. At this temperature, small evaporated and inhaled doses are lethal.

What is needed are PIN photodiodes and APDs that overcome the disadvantages of current PIN photodiodes and APDs.

SUMMARY OF THE INVENTION

In one aspect the invention relates to a high bandwidth shallow mesa semiconductor photodiode responsive to incident electromagnetic radiation. The photodiode includes an absorption narrow bandgap layer, a wide bandgap layer disposed substantially adjacent to the absorption layer, a first doped layer having a first conductivity type disposed substantially adjacent to the wide bandgap layer, and a passivation region disposed substantially adjacent to the wide bandgap layer and the first doped layer.

In one embodiment, the photodiode also includes a second doped layer disposed substantially adjacent to the absorption narrow bandgap layer. In another embodiment the photodiode also includes a third doped layer disposed substantially adjacent to the first doped layer and adapted to form an ohmic contact with a substantially adjacent metalization layer. In an additional embodiment, the photodiode also includes a second doped layer and an impact layer disposed substantially adjacent to the second doped layer and the absorption narrow bandgap layer. The ratio of the ionization coefficient for electrons relative to the ionization coefficient for holes for the impact layer is larger than the corresponding ratio for the absorption narrow bandgap layer, the wide bandgap layer, the first doped layer, and the second doped layer.

In a further embodiment, the first doped layer includes indium phosphide. In yet another embodiment, the absorption layer comprises indium gallium arsenide. In yet an additional embodiment, the wide bandgap layer varies in thickness from a deposition thickness $t_1$ to an etching thickness $t_2$.

In another aspect the invention relates a method for fabricating high bandwidth shallow mesa semiconductor photodiode responsive to incident electromagnetic radiation. The method includes generating an absorption narrow bandgap layer, generating a wide bandgap layer disposed substantially adjacent to the absorption narrow bandgap layer, generating a first doped layer disposed substantially adjacent to the wide bandgap layer. The first doped layer has a first conductivity type. The method also includes etching a region of the first doped layer, etching a region of the intrinsic wide bandgap layer, and generating a passivation layer disposed substantially adjacent to the first doped layer and the intrinsic wide bandgap layer.

BRIEF DESCRIPTION OF THE DRAWINGS

The above and further advantages of the invention may be better understood by referring to the following description taken in conjunction with the accompanying drawings, in which.

DETAILED DESCRIPTION

Figure 1:
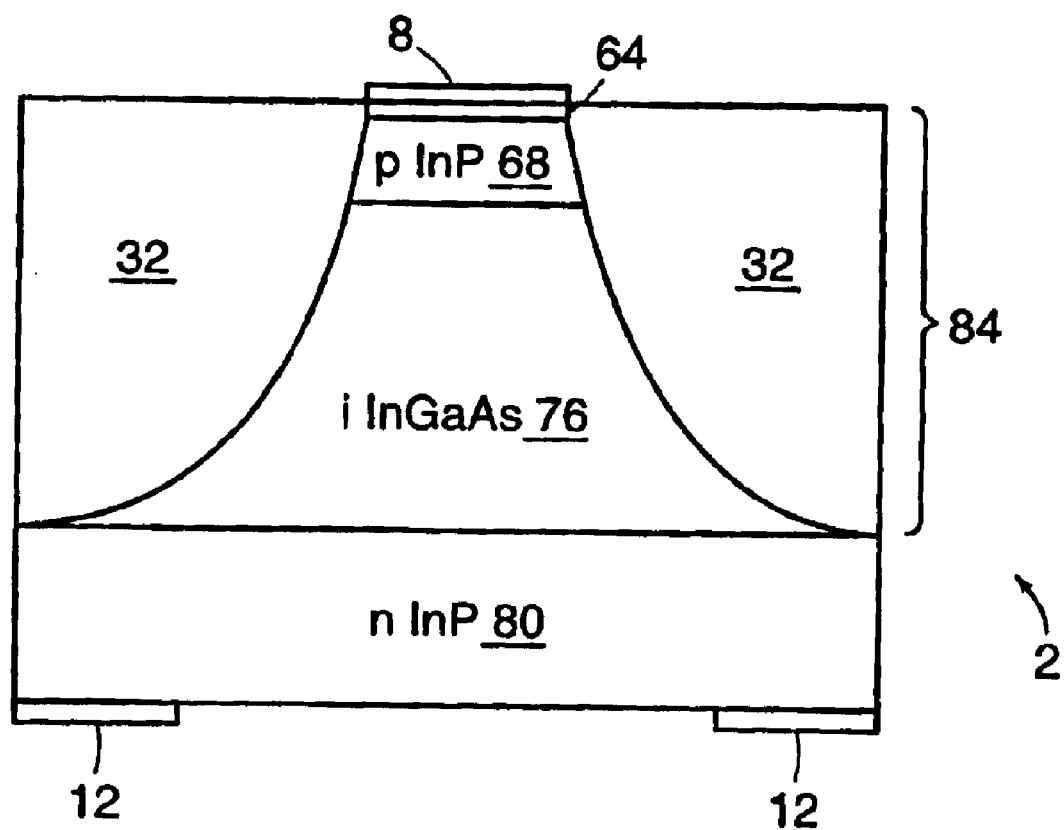
FIG. 1 is a mesa PIN photodiode as known to the prior art.
Figure 2:
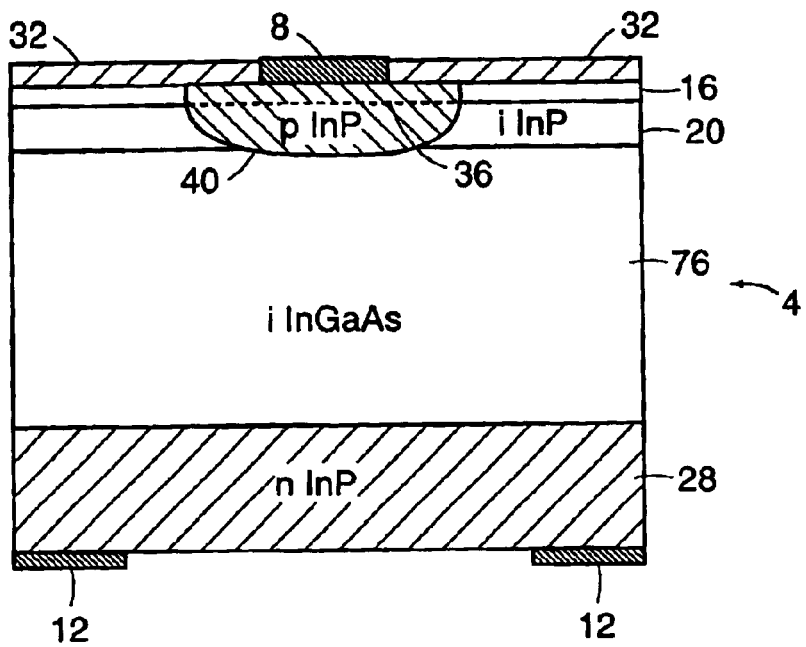
FIG. 2 is a planar PIN photodiode as known to the prior art.
Figure 3:
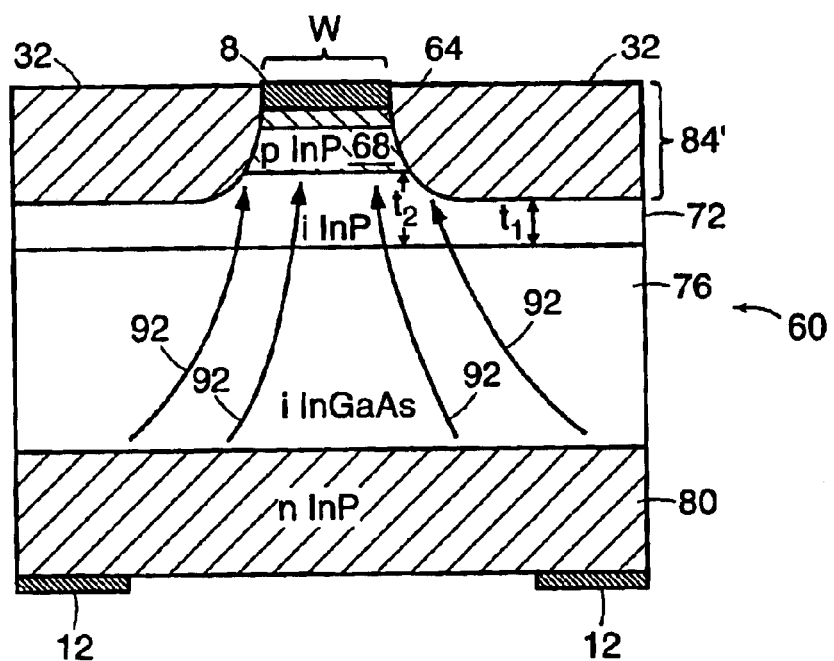
FIG. 3 is an embodiment of a PIN photodiode according to the invention.

Referring to FIG. 3, one embodiment of a shallow mesa planar PIN photodiode 60 according to the invention is shown. The PIN photodiode 60 includes a top metal contact 8, two bottoms metal contacts 12, a p-doped $In_{0.53}Ga_{0.47}As$ ohmic contact layer 64 latticed matched to InP, a p-doped InP layer 68, a wide bandgap intrinsic InP layer 72, an intrinsic narrow bandgap $In_{0.53}Ga_{0.47}As$ absorption layer 76 lattice matched to InP, a n-doped InP layer 80, and passivation regions 32.

In an alternative embodiment, the wide bandgap intrinsic InP layer 72 is replaced with Indium/Aluminum/Arsenide $(In_xAl_{1-x}As)$ lattice matched to InP. In one embodiment, the shallow mesa planar PIN photodiode 60 operates according to the principles of back illumination. In this embodiment, the photons in an incident beam pass through the n-doped InP layer 80 and into the intrinsic $In_{0.53}Ga_{0.47}As$ absorption layer 76. In various other embodiments, the thickness of the layers and the dopant concentrations are selected according to Table 1.

TABLE 1

| Layer | Thickness | Dopant Concentration |
|---|---|---|
| p-$In_xGa_{1-x}As$ layer 64 | 50 nm | $1 \times 10^{18}$–$5 \times 10^{18}$ $cm^{-3}$ |
| p-InP layer 68 | 0.2–0.4 um | $1 \times 10^{18}$–$5 \times 10^{18}$ $cm^{-3}$ |
| i-InP layer 72 | 0.2–0.4 um | Not Applicable |
| i-$In_{0.53}Ga_{0.47}As$ layer 76 | 1–3 um | Not Applicable |
| n-InP layer 80 | 0.5–1 um | $1 \times 10^{18}$–$5 \times 10^{18}$ $cm^{-3}$ |

As part of fabrication the p-doped $In_{0.53}Ga_{0.47}As$ layer 64, the p-doped InP layer 68, the intrinsic InP layer 72, the intrinsic $In_{0.53}Ga_{0.47}As$ layer 76, and the n-doped InP layer 80 are deposited by MBE or MOCVD techniques. This means that the thickness of the layers 64, 68, 72, 76, 80 can be accurately controlled. Once all the layers 64, 68, 72, 76, 80 have been deposited, the mesa 84' is formed by etching through the p-doped $In_{0.53}Ga_{0.47}As$ layer 64 and the p-doped InP layer 68, and into the intrinsic InP layer 72. The etching process is controlled so that after completion the intrinsic InP layer 72 has a thickness $t_1$ in the range of 0.1–0.3 μm.

The lower bound on this range ensures that the intrinsic $In_{0.53}Ga_{0.47}As$ layer 76 is adequately protected from the introduction of defects from the passivation process. The deposition thickness $t_2$ of the intrinsic InP layer 72 is chosen so as to minimize the carrier-transit time increase introduced by the additional layer 72.

In general the introduction of defects into the intrinsic InP layer 72 during the passivation process does not lead to significant surface leakage current. This is due in part to the wideband gap of InP. In addition, potential dark current from this layer 72 is minimized by closely monitoring the etching process so that little of the sidewall of the intrinsic InP layer 72 is exposed. The passivated region of the InP layer 72 away from the mesa does not produce significant dark current because the electric field is relatively weak in this region. Similarly, the dark current from the p-doped $In_{0.53}Ga_{0.47}As$ layer 64 and the p-doped InP layer 68 is not significant because the electric field in these regions is low.

Due to the confined lateral extent W of the mesa 84', the electric field 92 is confined below and within the mesa 84'. This design feature defines the photosensitive region of the intrinsic $In_{0.53}Ga_{0.47}As$ layer 76, that is, the area of the intrinsic $In_{0.53}Ga_{0.47}As$ layer 76 containing the electric field 92.

Figure 4:
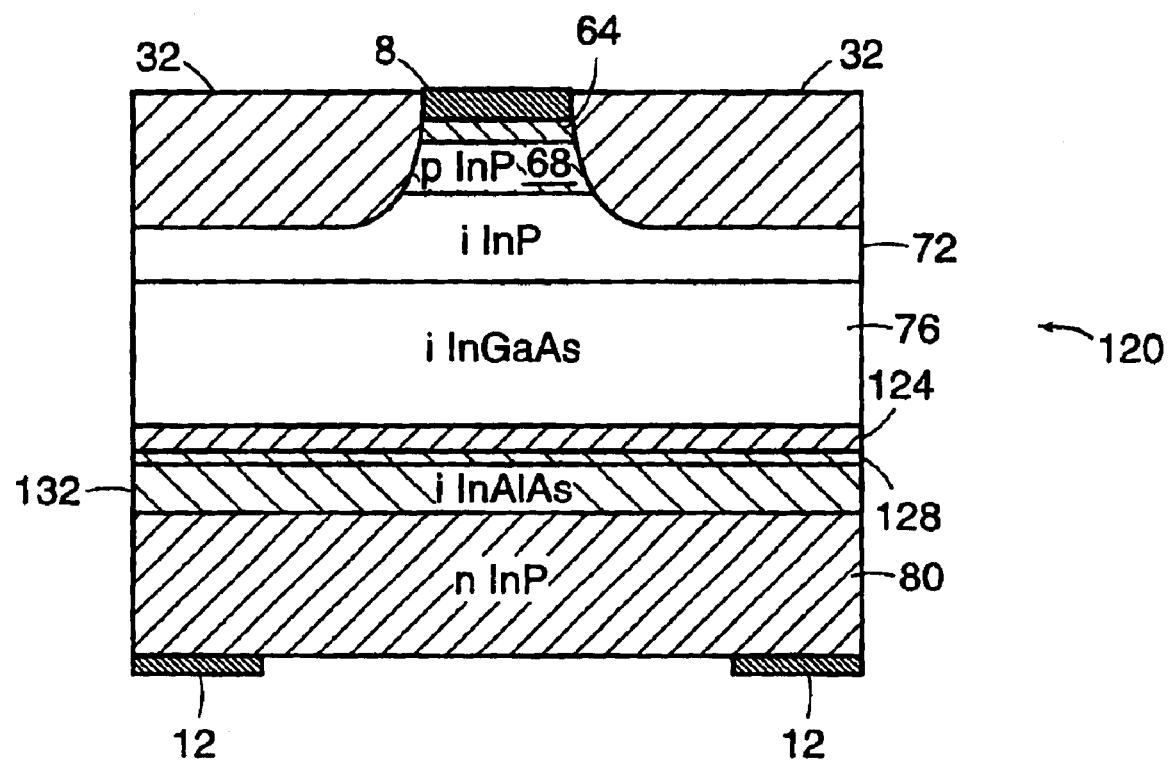
FIG. 4 is an embodiment of an avalanche photodiode according to the invention.

Referring to FIG. 4, one embodiment of a shallow mesa planar APD 120 according to the invention is shown. The structure and fabrication of the upper portion of the APD 120 is similar to the shallow mesa planar PIN photodiode 60 discussed for FIG. 3. In particular, the upper portion includes a top metal contact 8, post-etching passivation regions 32, a p-doped $In_{0.53}Ga_{0.47}As$ layer 64, a p-doped InP layer 68, an intrinsic InP layer 72, and an intrinsic $In_{0.53}Ga_{0.47}As$ absorption layer 76.

The lower portion of the APD photodiode 120 includes an intrinsic InAlGaAs layer 124, a p-doped InAlAs layer 128, an intrinsic InAlAs layer 132 latticed matched to InP, a n-doped InP layer 80, and two bottom metal contacts 12. The intrinsic InAlGaAs layer 124 is present for bandgap matching purposes. The p-doped InAlAs layer 128 is present to assist in the modulation of the electric field. The intrinsic InAlAs layer 132 provides a region of large electric field to drive the electron impact ionization avalanche process. This is achieved in the APD 120 because the ratio of the ionization coefficient for electrons relative to the ionization coefficient for holes for the intrinsic InAlAs layer 132 is large with respect to the ratios of the other layers 64, 68, 72, 76, 124, 128, 80.

In alternative embodiments of the shallow mesa planar APD 120, the thickness of the layers 64, 68, 72, 76 is varied as described above in Table 1. In an alternative embodiment, the wide bandgap intrinsic InP layer 72 is replaced with Indium/Aluminum/Arsenide $(In_xAl_{1-x}As)$ lattice matched to InP. In one embodiment, the shallow mesa planar APD 120 operates according to the principles of back illumination. In this embodiment, the photons in an incident optical beam pass through the n-doped InP layer 80 and into the intrinsic $In_{0.53}Ga_{0.47}As$ absorption layer 76. In various embodiments, the thickness of the layers 124, 128, 80 and their dopant concentrations are selected according to Table 2.

TABLE 2

| Layer | Thickness | Dopant Concentration |
|---|---|---|
| i-InAlGaAs layer 124 | 0.25 um | Not Applicable |
| InAlAs layer 128 | 0.2–0.5 um | $1 \times 10^{18}$–$5 \times 10^{18}$ $cm^{-3}$ |

TABLE 2-continued

| Layer | Thickness | Dopant Concentration |
|---|---|---|
| i-InAlAs layer 132 | 0.2–0.5 um | Not Applicable |
| n-InP layer 80 | 0.5–1 um | $1 \times 10^{18}$–$5 \times 10^{18}$ cm$^{-3}$ |

Figure 5:
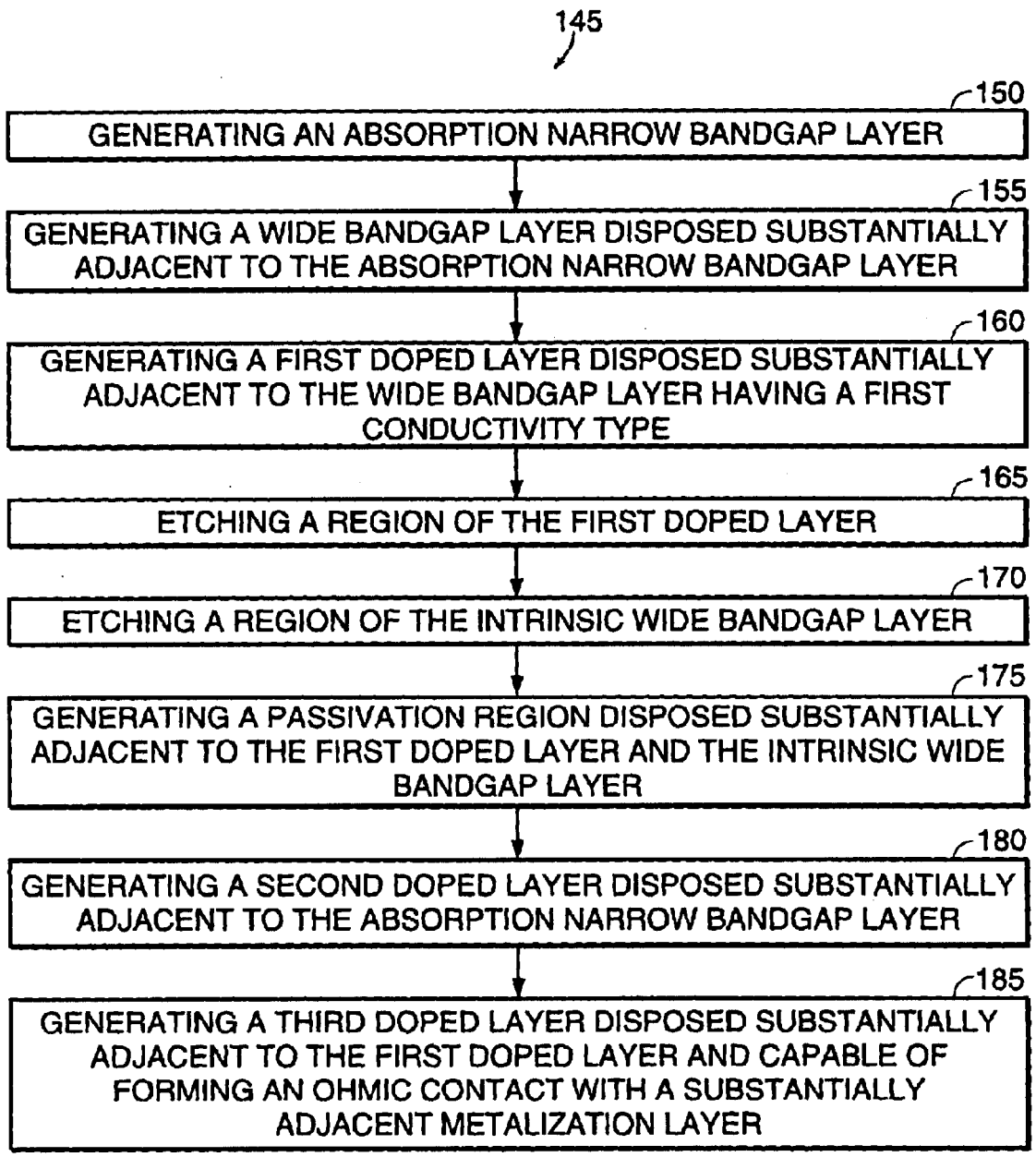
FIG. 5 is a flowchart representation of a method for fabricating a shallow-mesa PIN photodiode according to the invention.

Referring to FIG. 5 a flowchart representation of a method 145 for fabricating a shallow-mesa PIN photodiode according to the invention is shown. The method 145 includes generating an absorption narrow bandgap layer (step 150), for example in one embodiment intrinsic $In_{0.53}Ga_{0.47}As$, and generating a wide bandgap layer (step 155), for example in one embodiment intrinsic InP, substantially adjacent to the narrow bandgap layer. The method 145 also includes generating a first doped layer (step 160), for example in one embodiment p-doped InP, substantially adjacent to the wide bandgap layer. The first doped layer has a first conductivity type. The thickness of the first doped layer is determined in part according to the etching accuracy and is generally small compared to the other layers in order to minimize the carrier transit time increase introduced by its presence. The method 145 additionally includes etching a region of the first doped layer (step 165) and etching a region of the intrinsic wide bandgap layer (step 170). The method 145 further includes generating a passivation region (step 175) disposed substantially adjacent to the first doped layer and the intrinsic wide bandgap layer. In etching the intrinsic wide bandgap layer, the processes of step 170 are designed to ensure that an adequate thickness of the first doped layer remains to protect the absorption narrow bandgap layer from defects introduced during the passivation step 175.

In one embodiment, the method 145 also includes generating a second doped layer (step 180) disposed substantially adjacent to the absorption narrow bandgap layer. In another embodiment, the method 145 also includes generating a third doped layer (step 185) disposed substantially adjacent to the first doped layer and adapted to form an ohmic contact with a substantially adjacent metalization layer.

Figure 6:
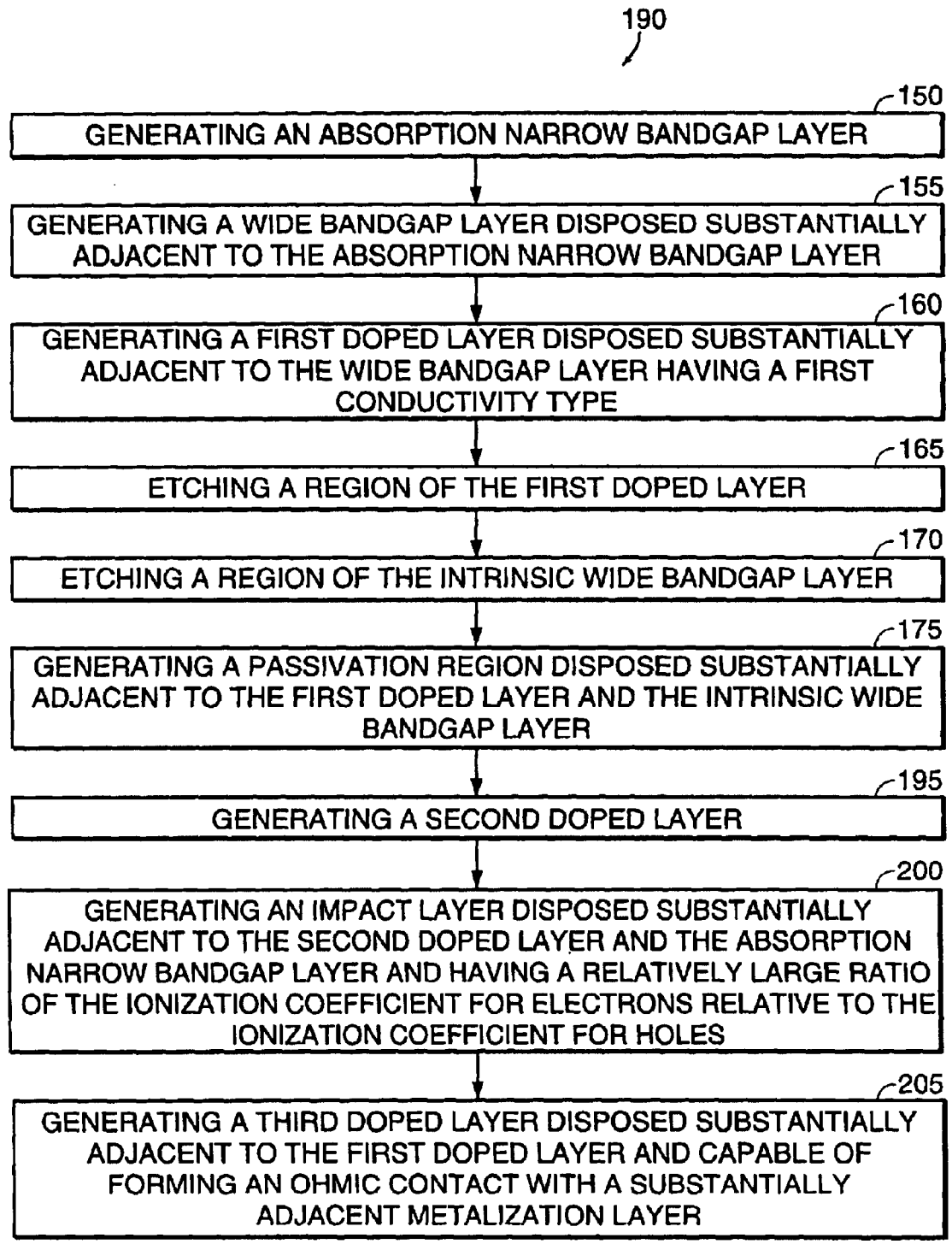
FIG. 6 is a flowchart representation of a method for fabricating a shallow-mesa APD according to the invention.

Referring to FIG. 6 a flowchart representation of a method 190 for fabricating a shallow-mesa APD according to the invention is shown. The operation of the steps 150 through 175 is as described above with respect to FIG. 5. The method shown in FIG. 6 also includes generating a second doped layer (step 195) and generating an impact layer (step 200) disposed substantially adjacent to the second doped layer and the absorption narrow bandgap layer. The impact layer is chosen so that the ratio of the ionization coefficient for electrons relative to the ionization coefficient for holes for the impact layer is larger than the corresponding ratio for the absorption narrow bandgap layer, the wide bandgap layer, the first doped layer, and the second doped layer. In one embodiment, the method 190 also includes generating a third doped layer (step 205) disposed substantially adjacent to the first doped layer and adapted to form an ohmic contact with a substantially adjacent metalization layer.

Those skilled in the art will recognize that the PIN and APD structures in FIGS. 3 and 4, respectively, each represent only a single PIN and APD embodiment and that the principles of the invention can equally well be applied to alternative PIN and APD structures known in the art.

Having described and shown the preferred embodiments of the invention, it will now become apparent to one of skill in the art that other embodiments incorporating the concepts may be used and that many variations are possible which will still be within the scope and spirit of the claimed invention. These embodiments should not be limited to disclosed embodiments but rather should be limited only by the spirit and scope of the following claims.

What is claimed is:

1. A high bandwidth semiconductor photodiode responsive to incident electromagnetic radiation comprising:

an absorption narrow bandgap layer;

a wide bandgap layer disposed substantially adjacent to the absorption layer;

a first doped layer having a first conductivity type disposed substantially adjacent to the wide bandgap layer;

a passivation region disposed substantially adjacent to the wide bandgap layer and the first doped layer;

a second doped layer; and an impact layer disposed substantially adjacent to the second doped layer and the absorption narrow bandgap layer, wherein the ratio of the ionization coefficient for electrons relative to the ionization coefficient for holes for the impact layer is larger than the corresponding ratio for the absorption narrow bandgap layer, the wide bandgap layer, the first doped layer, and the second doped layer.

2. The semiconductor photodiode of claim 1 wherein the second doped layer is disposed substantially adjacent to the absorption narrow bandgap layer.

3. The semiconductor photodiode of claim 2 further comprising a third doped layer disposed substantially adjacent to the first doped layer and adapted to form an ohmic contact with a substantially adjacent metalization layer.

4. The semiconductor photodiode of claim 1 wherein the first doped layer comprises indium phosphide.

5. The semiconductor photodiode of claim 1 wherein the absorption layer comprises indium gallium arsenide.

6. The semiconductor photodiode of claim 1 wherein the wide bandgap layer varies in thickness from an etching thickness $t_1$ to a deposition thickness $t_2$.

* * * * *